United States Patent [19]

Magnuson et al.

[11] Patent Number: 5,427,895
[45] Date of Patent: Jun. 27, 1995

[54] SEMI-SUBTRACTIVE CIRCUITIZATION

[75] Inventors: Roy H. Magnuson, Endicott; Richard W. Malek, Johnson City; Voya R. Markovich, Endwell; William E. Wilson, Waverly, all of N.Y.

[73] Assignee: International Business Machines Corporation, Armonk, N.Y.

[21] Appl. No.: 172,409

[22] Filed: Dec. 23, 1993

[51] Int. Cl.⁶ .................................................. G03F 7/00
[52] U.S. Cl. .................................... 430/314; 430/313; 430/318; 430/327
[58] Field of Search ................. 430/313, 314, 318, 327

[56] References Cited

U.S. PATENT DOCUMENTS

| | | | |
|---|---|---|---|
| 4,217,182 | 8/1980 | Cross | 204/15 |
| 4,388,351 | 6/1983 | Sawyer | 427/304 |
| 4,448,804 | 5/1984 | Amelio et al. | 427/98 |
| 4,526,810 | 7/1985 | Nesbitt | 427/98 |
| 4,748,104 | 5/1988 | Ferrier et al. | 430/315 |
| 4,770,899 | 9/1988 | Zeller | 427/96 |
| 4,770,900 | 9/1988 | Seibel | 427/97 |
| 4,782,007 | 11/1988 | Ferrier | 430/313 |
| 4,830,714 | 5/1989 | Sirinyan et al. | 204/24 |
| 4,863,758 | 9/1989 | Rhodenizer | 427/97 |
| 4,876,177 | 10/1989 | Akahoshi et al. | 430/313 |
| 4,931,148 | 6/1990 | Kukanskis et al. | 204/15 |
| 5,046,954 | 9/1991 | Schmedding | 439/70 |
| 5,302,492 | 4/1994 | Ott | 430/314 |
| 5,302,494 | 4/1994 | Grandmont | 430/325 |
| 5,311,660 | 5/1994 | Alpaugh | 29/852 |

OTHER PUBLICATIONS

Miersch, et al., Improving Adhesion of Copper Plating on Polyimide Film, IBM Technical Disclosure Bulletin, vol. 31, No. 7., Dec., 1988, pp. 1 and 2.

*Primary Examiner*—Marion E. McCamish
*Assistant Examiner*—Kathleen Duda
*Attorney, Agent, or Firm*—Pollock, Vande Sande & Priddy

[57] ABSTRACT

A process for selective plating of a metal onto a substrate surface is provided. The process includes laminating a layer of conductive metal onto a dielectric substrate; and providing thru holes extending through said layer of conductive metal and said dielectric substrate.

A thin layer of conductive metal is plated on the walls of the thru holes; and a photoresist layer is applied to the surface of the conductive metal and selectively exposed and developed to provide a mask corresponding to the negative of the desired circuit pattern.

The exposed metal that is not covered by the photoresist is removed and then the remaining photoresist is removed to thereby provide the desired circuit pattern. A conductive metal is plated on the pattern up to the desired thickness.

20 Claims, No Drawings

SEMI-SUBTRACTIVE CIRCUITIZATION

DESCRIPTION

Technical Field

The present invention is concerned with a method for selective plating of a metal onto a substrate surface. The present invention is especially directed to providing high-quality articles, such as those to be employed in printed circuit applications, such as printed circuit boards.

The process of the present invention makes it possible to provide for improved circuit line tolerances, along with good metal adhesion. The process of the present invention also provides for high quality, uniform metal plating in thru holes.

The process of the present invention also makes it possible to reduce the formation of extraneous copper or nodules.

Background Art

There are three general sequences that are currently used in the mass production of printed circuit boards and cards. These are referred to as full subtractive, full additive and semi-additive.

In the full subtractive processing, copper foil is laminated to a dielectric substrate, followed by drilling of thru-holes or vias in the substrate. The thru-holes are cleaned, and the panel is then seeded and fully electrolytically plated.

The circuit lines are defined by photo patterning and subtractive etching the plated substrate. In the full additive sequence, as practice on the advanced panel line, the dielectric is first roughened by lamination of sacrificial foil and etching of the foil. The thru-holes are then drilled and cleaned. The substrate and thru-holes are seeded. Photo patterning defines the circuit line pattern leaving seed exposed at the bottom of the line channels. The panel is then autocatalytically or electrolessly plated, followed by stripping of the resist. In the case of composites, a drill mask must be applied to prevent etching of the dielectric surface during cleaning of thru holes. This mask is peeled and the surface is chemically cleaned before seeding.

In the semi-additive (or pattern plate) sequence, a photoresist is imaged on top of a relatively thin copper foil. Circuit lines are plated either electrolytically or autocatalytically. After an etch mask is applied to the tops of the circuit line, the resist is stripped, the substrate copper etched away, and the etch mask stripped.

Even though the above techniques are quite useful, there is still a need for improvement, and particularly from the viewpoint of providing circuit lines with tight tolerances. It would also be advantageous if the drill tape step mentioned above could be eliminated.

SUMMARY OF INVENTION

The present invention provides a process for selectively plating of a metal onto a substrate surface that provides for improved circuit line tolerances. The process of the present invention also provides for good adhesion of the metal, and high quality metal plating in thru holes. The formation of extraneous copper or nodules is also limited by the process of the present invention.

In particular, the process of the present invention comprises laminating a layer of conductive metal onto a dielectric substrate, and providing thru holes extending through said layer of conductive metal and said dielectric substrate.

A thin layer of metal is plated on the substrate and in the thru holes. The layer is typically about 0.05 to about 0.1 mils thick. A photoresist is applied to the surface of the conductive and selectively exposed, and developed to provide a negative of the desired circuit pattern. The exposed metal that is not covered by the photoresist is removed to thereby provide the desired circuit pattern. Then a conductive metal is plated onto the circuit pattern and thru holes up to the desired thickness.

BEST AND VARIOUS MODES FOR CARRYING OUT INVENTION

The process of the present invention is applicable to plating a wide variety of dielectric (non-conductor) substrates. Dielectric substrates described in the prior art, including thermoplastic and thermosetting resins may be plated in accordance with the present invention.

Typical thermosetting polymeric materials include epoxy, phenolic based materials, and polyamides. The dielectric materials may be molded articles of the polymers containing fillers and/or reinforcing agents, such as glass-filed epoxy or phenolic based materials. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, and ABS polymers.

More typically, the dielectric substrates employed are FR-4 epoxy compositions.

A typical FR-4 epoxy composition contains 70–90 parts of brominated polyglycidyl ether of bisphenol-A and 10–30 parts of tetrakis (hydroxyphenyl) ethane tetraglycidyl ether cured with 3 to 4 parts of dicyandiamide, and 0.2 to 0.4 parts of a tertiary amine, all parts being parts by weight per 100 parts of resin solids.

Another typical FR-4 epoxy composition contains:
a) about 25 to about 30 parts by weight of a tetrabrominated diglycidyl ether of bisphenol-A, having an epoxy equivalent weight of about 350 to about 450;
b) about 10 to about 15 parts by weight of a tetrabrominated diglycidyl ether of bisphenol-A, having an epoxy equivalent weight of about 600 to about 750; and
c) about 55 to about 65 parts by weight of at least one epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 part of 2-methyl imidazole.

Still another FR-4 epoxy composition employs tetrabromo bisphenol-A as the curing agent, along with 2-methyl imidazole as the catalyst.

A layer of a conductive metal having a roughened surface, such as a copper sheet is laminated onto at least one of the major surfaces of the dielectric substrate. This is carried out by pressing the roughened surface of the copper sheet against the substrate surface.

Examples of some typical copper foils are disclosed in U.S. Pat. Nos. 3,918,926, 3,998,601 and 4,075,757, disclosures of which are incorporated herein by reference.

For instance, the copper foil contains an electrodeposited copper support layer and a second electrodeposited copper layer of a thickness which is not self-supporting, such as about 2 to about 12 microns. Also, the foil can include a release layer such as chromium, which remains with the support layer. In addition, a chromium interface is present between the support and non-supporting copper layers.

Bonding of a dielectric material substrate to the copper foil is carried out by pressing together a sheet of the dielectric substrate material and a sheet of the copper foil prepared according to the present invention with the treated surface next to or confronting the dielectric material, in a preheated laminating press at a predetermined pressure and temperature as, for example, about 260 to about 800 psi, and preferably about 500 psi and about 340° F. The time of the pressing operation is variable depending upon the particular dielectric substrate material employed and the pressure employed. About 1 hour is adequate for the above conditions. The supporting copper layer is then peeled away from the non-supporting copper layer, leaving only the thin non-supporting copper layer on the dielectric substrate. The layer of laminated metal is typically about 0.7 to 1.4 mils thick.

Thru-holes are now drilled through the substrate preferably by a laser beam. Also, if desired, blind holes or vias can be drilled in the substrate. Typically, the thru holes are about 0.018 to about 0.044 inches in diameter and the via holes about 0.006 to about 0.020, and more typically, about 0.014 inches in diameter. Subsequently, the holes are cleaned or desmeared for removal of drill smear. Typical desmear processes include solvent treatment with, for example, N-methyl pyrrolidone, followed by treatment in a chrome sulfuric acid composition.

The substrate and holes are then seeded for plating. Although not preferred, it is possible, if desired, to remove the laminated metal layer prior to the seeding. This can be done by etching, using an aqueous solution free of complexing agents, and containing $CuCl_2$ and HCl. An aqueous solution of persulfate can also be used as the etching agent. However, best results are achieved by maintaining the laminated metal layer on the substrate at this stage of the process.

The seeding is preferably achieved employing the steps discussed hereinbelow. The substrate is cleansed with an alkaline cleaner to remove dirt and finger oils. A typical cleaning treatment includes employing an alkaline cleanser, such as K2 solution, or a solution containing sodium phosphate and sodium silicate, and having a pH of about 13. The treatment is usually for about 1 to about 15 minutes, typical of which is about 5 minutes.

In the next step, the substrate surface including the holes is treated with an acidic solution, containing a multifunctional ionic copolymer, containing at least two available cationic functional moieties. The preferred ionic moieties are quaternary phosphonium and quaternary ammonium groups. Copolymers containing at least two cationic moieties, such as, for example, copolymers of polyacrylamide forming the inert backbone and functionally active tetraalkylammonium compounds, are commercially available and need not be described herein in detail. Multifunctional cationic copolymers of that type are Reten 210, and Reten 220, available from HERCULES, description of which can be found in "Water-Soluble Polymers," Bulletin VC-482A, HERCULES, Inc., Wilmington, Del., 1989, disclosure of which is incorporated herein by reference.

Reten 210 is in powder form and is a copolymer of acrylamide and beta-methacryloxyethyltrimethylammonium methyl sulphate, of which a 1% solution has a Brookfield viscosity of 600–1000 cps. Reten 220 is also in powder form and consists of the same monomers as Reten 210, but its 1% solution has a Brookfield viscosity of 800–1200 cps. The molecular weights of the Reten polymers are usually relatively high and vary from about 50,000 to about 1,000,000 or more. The quaternary ammonium groups provide the number of positive charges of the polymer.

In the preferred aspects of the present invention, the ionic copolymer is employed as a dilute acidic solution of about 0.01% to about 1% by weight, and preferably about 0.05% to about 0.5% by weight of the copolymer. The acid contained in the solution is preferably $H_2SO_4$, and the pH value of the solution is between 0 and about 3. The use of a low pH value is preferred to obtain a relatively low viscosity of the copolymer solution to facilitate application of the polymer. The treatment with the ionic copolymer is generally about 1 minute to about 10 minutes, and preferably about 1 minute to about 2 minutes, and takes place at about room temperature.

The multifunctional copolymer, having a very good adhesion to the substrate surface, provides the surface with a charge opposite from that associated with the seed particles to be subsequently applied to the substrate. This difference in polarity provides for electrostatic attraction of the seed particles. After the substrate is brought into contact with the ionic copolymer composition, the substrate is rinsed to remove any access polymer not adhering to the substrate surface.

The substrate surface is then preferably subjected to a persulfate micro etch technique to remove any surface treatments from the laminated metal (e.g., copper), which also removes the copolymer from the metal surface, but leaves such remaining in the holes. Of course, if the laminated metal had been previously removed, then this persulfate would not be used.

Next, the substrate and holes are contacted with a composition containing a catalytic composition capable of initiating the electroless plating process. The compositions contain a metal which can directly provide the catalytic sites, or serve as a precursor which leads to the catalytic sites. The metal present may be in the elemental form, an alloy, or compound, or mixtures thereof. The preferred metal catalysts are precious metals, such as gold, palladium, and platinum. In addition, in view of the improved conditioning of the substrate achieved by employing the multifunctional polymer, the catalyst can be a non-precious metal, such as copper, nickel, cobalt, iron, zinc, manganese, and aluminum.

The most preferred catalyst is palladium. A typical palladium composition contains about 1.2 to about 2.5 grams per liter of a palladium salt, which is preferably $PdCl_2$, about 80 to about 150 grams per liter of a stannous salt, which is preferably $SnCl_2 2H_2O$, and about 100 to about 150 milliliters per liter of an acid which is preferably HCl. When HCl is provided in the form of a 37% HCl solution, about 280 to about 360 milliliters of the HCl solution is preferably employed. The most preferred compositions contains about 1.5 grams per liter of $PdCl_2$ and about 280 milliliters per liter of 37% HCl. The composition is usually maintained at a temperature of about 65°±10° F.

A typical triple-seeder process is disclosed, for instance, in Alpaugh, et al., U.S. Pat. No. 4,525,390, disclosure of which is incorporated herein by reference.

Subsequently, the substrate is treated with an alkaline accelerator, such as a 2% NaOH solution to remove excess tin, which is typically deposited along with the Pd catalyst. This step usually takes about ½ to about 5 and more typically, about ½ to about 2 minutes.

The substrates are then dried, such as being vacuum dried in an oven for 20 minutes at a temperature of about 65° C. In the drying operation, all the water is driven off irreversibly from the colloidal particles, leaving a shell of oxygen in the form of insoluble tin oxide.

The above seeding sequence is preferred, since it insures against loss of adhesion between the laminated metal (e.g., copper foil) on the substrate surface and the subsequently plated metal, such as electroless copper.

After seeding, the substrates are then plated with a relatively thin layer of a conductive metal, such as nickel, or preferably copper.

This plating can be referred to as a flash plating, and is typically about 0.025 to about 0.1 mils, and preferably about 0.05 to about 0.1 mils. The plating is typically carried out employing a copper electroless flash bath. This first electroless plating bath employed typically contains up to about 2.3 ppm, and preferably about 0.2 to about 2.3 ppm and most preferably, about 0.5 to about 2 ppm of cyanide ions.

The first electroless plating bath employed has an oxygen content of not lower than 1 ppm below saturation, and preferably not lower than 0.5 ppm below saturation. In the most preferred aspects of the present invention, the oxygen content of the first electroless plating bath is at or about at the saturation level achievable using air. These values of the oxygen content are for the bath when at a room temperature of about 70° C. to 80° C.

The first copper electroless plating bath employed is generally an aqueous composition, which contains a source of cupric ion, a complexing agent for the cupric ion, and a pH adjustor, in addition to the cyanide ion source and oxygen. In addition, the plating bath also preferably includes a surface-active agent.

The cupric ion source generally used is a cupric sulfate or a cupric salt of the complexing agent to be employed.

The cupric ion source is employed in amounts of about 7 to about 12 grams per liter and preferably, about 8.0 to about 10.0 grams per liter and most preferably, about 8.5 to about 9.5 grams per liter, calculated as $CuSO_4-5H_2O$. In other words, when the cupric ion source is $CuSO_4-5H_2O$, then the amount is about 7 to about 12 grams per liter, and when the source is a different material, the amount employed will be such that the same amount of cupric ion will be present in the bath as when $CuSO_4-5H_2O$ is used.

Examples of some cyanides which can be employed according to the present invention are the alkali metal, alkaline earth metal, and ammonium cyanides, with sodium cyanide being preferred.

The most common reducing agent employed is formaldehyde. Examples of some other reducing agents include formaldehyde precursors or formaldehyde homopolymers, such as paraformaldehyde, trioxane, and gloxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents.

The reducing agent is generally present in amounts from about 1 to about 6 milliliters per liter, preferably about 2 to about 4 milliliters per liter, and more preferably from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)lactone, modified ethylene diamine acetates, such as N-hydroxy ethyl ethylene diamine triacetate. In addition, a number of other suitable cupric complexing agents are suggested in U.S. Pat. Nos. 2,996,408; 3,075,856; 3,076,855; and 2,938,805. The preferred complexing agents are ethylene diamine tetraacetic acid and the alkali metal salts thereof.

The amount of complexing agent employed in the first plating bath is about 30 to about 50 grams per liter.

The plating bath can also include a surfactant which assists in wetting the surface to be coated. A satisfactory surfactant is, for instance, an organic phosphate ester, available under the trade designation "Gafac RE-610." Generally, the surfactant is present in amounts from about 0.02 to about 0.3 grams per liter.

In addition, the pH of the bath is generally controlled, for instance, by the addition of a basic compound, such as sodium hydroxide or potassium hydroxide, in the desired amount to achieve the desired pH. The preferred pH of the first electroless plating bath is between 11.5 and 12.0, and most preferably between 11.6 and 11.8.

In addition, the plating bath can include other minor additives, as is known in the art.

The preferred plating baths employed have a specific gravity within the range of 1.06 to 1.08. Moreover, the temperature of the bath is preferably maintained between about 70° C. and 80° C., more preferably between about 70° C. and 75° C., and most preferably about 72° C. to about 74° C.

The plating with the initial electroless plating bath is generally carried out for about 15 minutes to up to about 2 hours and preferably about ½ to 1½ hours. The total thickness of the laminated metal and thin layer of metal is about 0.725 to about 1.6 mils.

The next aspect of the process is the subtractive circuitization. It is known that the ability to hold tolerances on etched features is directly related to the thickness's of the surface copper. However, subtractive processing in the prior art typically involves the etching of a circuit pattern onto a panel which has been plated to its full height. The process of the present invention, on the other hand, requires that the subtractive circuitization be carried out before the panel is plated to height. Table I hereinbelow shows a comparison of etched line tolerances on panels of varying copper thickness's.

TABLE I

| PROCESS | COPPER THICKNESS (Microns) | LINE WIDTH | STANDARD DEVIATION |
|---|---|---|---|
| Semi-subtractive | 15 | 3.65 | .18 |
| Full subtractive | 40 | 5.05 | .363 |
| Full subtractive | 48 | 5.19 | .437 |

The subtractive processing preferably includes the sequence discussed hereinbelow. In particular, a photoresist is applied to the substrate. The resist which can be employed according to the present invention include both positive and negative resists.

Examples of some photoresists employed, according to the present invention, include negative or photohardenable polymerizable compositions of the type suggested in U.S. Pat. Nos. 3,469,982; 3,526,504; 3,867,153; and 3,448,098, and published European Patent Application 0049504, disclosures of which are incorporated herein by reference. Polymers from methylmethacrylate and from glycidyl acrylate and/or from a polyacrylate, such as trimethylol propane triacylate and pentaerythritol triacrylate, are commercially available from E. I. Du Pont de Nemours and Company under the trade designation "Riston."

Examples of some negative photoresists employed, according to the present invention, are from polymethylmethacrylates such as those commercially available from E. I. du Pont de Nemours and Company, under the trade designations "Riston 3120," "Riston T-168" and "Riston 3515." T-168 is a negative photoresist material from polymethylmethacrylate and crosslinkable monomeric units, such as from trimethylol propane triacrylate. A detailed discussion of preparing a negative resist from polymethylmethacrylate, trimethylol propane triacrylate and trimethylene glycol diacetate can be found in Example 1 of U.S. Pat. No. 3,867,153. Riston 3120 is an acrylate based negative photoresist material containing carboxylic groups and is developable in an aqueous medium.

Examples of aqueous developable negative photoresists are described in published European Patent Application 0049504, such as Example 23 thereof, disclosure of which is incorporated herein by reference. A typical resist described therein is from a copolymer of methylmethacrylate, ethyl acrylate, and acrylic acid, and a copolymer of styrene and maleic anhydride isobutyl ester.

An example of another type of photoresist is based on phenol formaldehyde novalak polymers. A particular example of such is Shipley AZ1350, which is an m-cresol formaldehyde novalak polymer composition. Such is a positive resist composition and includes therein, diazoketone, such as 2-diazo-1-naphthol-5-sulphonic acid ester. In such a composition, the orthodiazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight, of the diazoketone compound.

The photoresist is typically applied to a thickness of about 0.5 to about 3 mils.

The layer of resist material is then selectively exposed to the desired pattern and imaged by a known technique, such as ultraviolet light, electron beam, or X-ray beam technique, followed by removal of the exposed portions in the case of positive resist materials, by etching or dissolution in an appropriate liquid. In the case of negative resist materials, the unexposed portions are removed.

The resist is developed to provide a negative of the desired circuit pattern. The exposed metal that is not covered by the remaining photoresist pattern is then etched to provide the desired circuit pattern. In the case of copper, the etching can be carried out employing a solution of persulfate or an aqueous solution free of complexing agents and containing $CuCl_2$ and HCl.

The remaining photoresist is removed by dissolution in a suitable solvent. In the case of Riston 3120, the resist is stripped by employing methylene chloride.

The substrate is then preferably cleaned prior to the final plating. In particular, the following clean sequence best prepares the surface copper for plating and also cleans the laminate of contaminants which have been shown, upon exposure to the additive plating solution, to adversely affect its properties. The process sequence includes an alkaline cleaning step, such as a $K_2$ alkaline cleaning procedure, preferably carried out at about 60° C. for about 2 minutes, followed by hot rinsing in deionized water. Next, the substrate is contacted with a 25% HCl solution at ambient temperature for about 1 minute, followed by rinsing in deionized water at ambient temperatures. The substrate or panel is then oven dried, for example, vacuum dried in an oven for 20 minutes at a temperature of about 65° C.

The panel is now ready for final plate up, wherein the circuitized panel is precleaned with hydrochloric acid (8%, 1 min.), rinsed twice with deionized water, then placed directly into the electroless copper plating bath and the required amount of copper deposited onto the circuitized features and drilled holes. The use of the electroless plating bath at this point in the process presents a unique advantage over alternative processes in terms of the ability to maintain tight tolerances of circuit line features and thru hole plated copper quantity. The autocatalytic electroless copper bath has 100% throwing power in the PTH's plated thru holes. Typically, an electrolytic process will produce only 80–90% throwing power on an 8 to 1 aspect ratio hole; therefore, requiring that the surface of the panel be overplated in order to achieve the minimum copper requirement in the PTH. This overplating on the surface results in lower process capability at the subtractive circuitization process.

The process of the present invention achieves the best surface line tolerances by etching of the thin copper foil and subsequent plate up in a highly controllable electroless copper bath, where the ratio of surface copper to PTH copper is 1 to 1. The parameters of the electroless copper plating bath, during the plate up cycle, are important in achieving the most preferred results obtaining by the present invention. For instance, an overactive plating bath can result in the deposit of extraneous copper onto the non-functional areas of the circuit panel. It has been found that the EMIX potential of the bath is preferably maintained at a value which is less negative than −650 MV -vs- Calomel electrode. It is likewise preferred that the formaldehyde concentration be maintained at a concentration less than 20 ml/l, higher concentrations tend to result in an unstable plating bath and unacceptable copper ductility. The adhesion of the circuit line to the panel is almost exclusively determined by the width of the etched circuit feature. Testing has born out the fact that the plated copper does not add to the adhesion of the circuit line features in any significant amount.

This second electroless plating bath contains about 5 to about 11 ppm, and preferably about 5 to about 8 ppm of cyanide ions.

The second electroless plating bath employed has an oxygen content of not lower than 1.5 ppm below saturation, preferably an oxygen content of not lower than 1.0 ppm below saturation, and more preferably not lower than 0.5 ppm below saturation. In the most preferred aspects, the oxygen content of the second electroless plating bath is at or about saturation.

The values of the oxygen content are for the bath when at a temperature of about 70° C. to about 80° C.

The oxygen saturation level of the baths in accordance with the present invention at temperatures of about 70° C. to 80° C. is typically about 3.5.

The above amounts of oxygen are those measured at the bath temperature by employing a Leeds & Northrup dissolved oxygen meter and probe as calibrated to air saturation in deionized water at the bath temperature.

The level of the oxygen is maintained by introducing into the plating tank a mixture of oxygen and inert gas, preferably by adding air. Mixed with the air or oxygen can be an inert gas such as hydrogen, nitrogen, argon, neon, and krypton. At a plating temperature of about 73° C.±0.5° C., about 1.0 to 3.0 SCFM (standard cubic feed per minute) per thousand gallons of bath of air are employed.

When used, the inert gas is preferably premixed with the oxygen or air prior to the introduction into the bath. However, the individual gases can be introduced into the bath separately, if desired.

The cupric ion source in the second electroless plating bath is employed in amounts of about 9 to about 14, and preferably about 10 to about 12 grams per liter, calculated as $CuSO_4 \cdot 5H_2O$.

The reducing agent is present in amounts of about 1 to about 4 milliliters per liter, and preferably about 2 to about 2.5 milliliters per liter. The preferred reducing agent is formaldehyde, and is preferably employed as a 37% solution. The above amounts of formaldehyde are the values obtained by the sodium sulfite method by titration to a pH of 9.00, as generally discussed by Walker, Formaldehyde, Third Edition, 1975, pages 486–488, Robert E. Krieger Publishing Company, Huntington, N.Y.

The amount of complexing agent employed in the second electroless plating bath is about 25 to about 50 grams per liter, and preferably about 30 to about 40 grams per liter.

The amount of surfactant, if present, is usually about 0.01 to about 0.3 grams per liter.

In addition, the preferred pH of the second electroless plating bath is between 11.6 and 12.0, and most preferably between 11.7 and 11.9. In addition, the second electroless plating bath has a specific gravity within the range of 1.060 to 1,080. Moreover, the temperature of the second electroless plating bath is preferably maintained between about 70° C. and 80° C., and more preferably between about 70° C. and 76° C., and most preferably about 72° C. to about 75° C.

The plating from the second electroless plating bath is generally from about 8 to about 20 hours, or until the desired thickness of copper film is achieved, which is typically about 0.5 to about 2 mils.

What is claimed is:

1. A process for selective plating of a metal onto a substrate surface which comprises:
   laminating a layer of conductive metal onto a dielectric substrate;
   providing thru holes extending through said layer of conductive metal and said dielectric substrate;
   electrolessly flash plating a thin layer of up to about 0.025 to about 0.1 mils of a conductive metal on said substrate and on the walls of said thru holes; seeding said thru holes prior to plating said thin layer of metal;
   applying a photoresist layer to the surface of the conductive metal and selectively exposing and developing the photoresist to provide a mask corresponding to the negative of the desired circuit pattern;
   then removing the expose metal portion of said thin layer and said layer of conductive metal that is not covered by the photoresist; removing the remaining photoresist to thereby provide the desired circuit pattern; and then electrolessly plating using a bath different from the flash plating onto said circuit pattern and in said thru holes a conductive metal up to the desired thickness.

2. The process of claim 1 wherein said laminating comprises laminating a layer of copper of about 0.7 to about 1.4 mils thick.

3. The process of claim 1 which further comprises desmearing said thru holes.

4. The process of claim 1 wherein said seeding includes contacting with a seeder composition containing palladium and tin.

5. The process of claim 4 wherein prior to contacting with the seeder composition, the substrate is contacted with a composition containing a multifunctional ionic polymer material containing at least two available ionic moieties, wherein said ionic moieties are of a charge opposite from the charge associated with the seeder particles to be subsequently applied to the substrate.

6. The process of claim 5 wherein said multifunctional ionic polymer material is a multifunctional cationic material.

7. The process of claim 5 wherein said multifunctional ionic polymer material is a copolymer of acrylamide and ammonium quaternary compounds.

8. The process of claim 5 wherein said multifunctional ionic polymer material is a copolymer of acrylamide and betamethacryloxyethyltrimethyl ammonium methyl sulfate.

9. The process of claim 5 wherein prior to contacting with said composition containing said ionic polymer material, the substrate is cleaned with an alkaline cleaner.

10. The process of claim 5 wherein after contacting with said composition containing said ionic polymer and prior to contacting with said seeder composition, the substrate is subjected to a persulfate etch.

11. The process of claim 4 wherein said substrate is treated with an alkaline accelerator subsequent to contact with said seeder composition.

12. The process of claim 11 wherein said substrate is oven dried after said alkaline accelerator.

13. The process of claim 1 wherein said thin layer is copper.

14. The process of claim 13 wherein said thin layer is about 0.05 to about 0.1 mil thick.

15. The process of claim 1 wherein the total thickness of the laminated metal and the thin layer of metal is about 0.725 to about 1.6 mils.

16. The process of claim 1 wherein said photoresist is a negative photoresist that is developable in aqueous alkaline solution.

17. The process of claim 1 wherein the substrate is cleaned after stripping of the photoresist and prior to the final plating.

18. The process of claim 17 wherein said cleaning includes an alkaline cleaning followed by treatment with an acidic composition.

19. The process of claim 1 wherein the plating up to the desired thickness employs a copper electroless plating composition having an E-MIX potential less negative than −650 MV vs calomel electrode and less than 20 ml/l of formaldehyde.

20. The process of claim 1 wherein said second bath is controllable to provide a ratio of metal on said substrate to that in said thru hole of 1 to 1.

* * * * *